United States Patent [19]

te Velde et al.

[11] Patent Number: 4,460,914
[45] Date of Patent: Jul. 17, 1984

[54] PROGRAMMABLE SEMICONDUCTOR DEVICE AND METHOD OF MANUFACTURING SAME

[75] Inventors: Ties S. te Velde; Arie Slob, both of Eindhoven, Netherlands

[73] Assignee: U.S. Philips Corporation, New York, N.Y.

[21] Appl. No.: 258,112

[22] Filed: Apr. 27, 1981

[30] Foreign Application Priority Data

May 8, 1980 [NL] Netherlands .................... 8002634

[51] Int. Cl.³ .................... H01L 27/04; G11C 11/40
[52] U.S. Cl. ........................ 357/51; 357/15; 357/68; 357/71; 357/49; 365/96
[58] Field of Search ............. 365/96, 104, 105, 106; 361/433; 357/68, 51, 72, 15, 71

[56] References Cited

U.S. PATENT DOCUMENTS

| | | | |
|---|---|---|---|
| 3,564,354 | 12/1968 | Aoki et al. | 357/68 |
| 3,778,886 | 12/1973 | Shields et al. | 365/96 |
| 4,070,654 | 1/1978 | Tachi | 357/15 |
| 4,169,271 | 9/1979 | Saitoh | 357/72 |
| 4,209,894 | 7/1980 | Keen | 29/577 R |
| 4,222,063 | 9/1980 | Rodgers | 357/45 |
| 4,224,656 | 9/1980 | De Matos et al. | 361/433 |

Primary Examiner—William D. Larkins
Attorney, Agent, or Firm—Jack E. Haken; James J. Cannon, Jr.

[57] ABSTRACT

A blowable fuse is provided over a part of its length separately from the walls of an enveloping cavity and separated from a supporting member. As a result of this the fuse is readily thermally isolated so that it fuses more rapidly and with less energy. In addition, a semiconductor circuit element, for example a Schottky diode, can be realized below a bridging part of a conductor which serves as an upper wall of the cavity, which results in a high bit density.

1 Claim, 11 Drawing Figures

PROGRAMMABLE SEMICONDUCTOR DEVICE AND METHOD OF MANUFACTURING SAME

BACKGROUND OF THE INVENTION

1. Field of the Invention

The invention relates to a programmable semiconductor device comprising a supporting member having at least a first line and at least a semiconductor circuit element connected to the line by means of a blowable fuse, in which the blowable fuse is situated at least over a part of its length at a distance from the supporting member or the semiconductor circuit element.

In addition the invention relates to a method of manufacturing such a semiconductor device.

A programmable semiconductor device of the above-mentioned kind may form part, for example, of a programmable read-only memory (PROM). Besides for a programmable read-only memory the programmable semiconductor device may also be used for a logic circuit of the type PLA (programmable logic array) in which the actual logic function of the circuit is established afterwards by means of a programming step.

2. Description of the Prior Art

A programmable semiconductor device of the kind mentioned in the opening paragraph is disclosed in U.S. Pat. No. 3,564,354. In this device the blowable fuse is formed by a narrow thin strip of metal, for example of aluminum, having accurately determined dimensions. Dependent on the information to be written, said fuse is blown selectively by means of current passage. In this device the fuse is covered at its upper side with a passivating layer and is thus partly surrounded by passivating material and in direct contact therewith. As a result of this a part of the energy generated in the metal strip by means of the blowing current is lost as a result of heating of the surrounding passivating layer. Moreover, the fusing time is extended so that writing lasts longer while the device may also be damaged.

If desired, the passivating layer on the upper side of the blowable fuse may be omitted but this is at the expense of the passivation of other parts of the device. Moreover, since the passivating layer is now entirely or partly absent, residues of the blowable fuse may land on the surface of the semiconductor device in the case of blowing and may cause short-circuits or other defects there.

SUMMARY OF THE INVENTION

One of the objects of the invention is to provide a programmable semiconductor device of the kind mentioned in the opening paragraph in which the writing time is substantially independent of the thermal conductivity between the fuse and the supporting member or a surrounding passivating layer.

Another object of the invention is to provide a programmable semiconductor device in which substantially no mechanical stresses as a result of the presence of a passivating layer occur in the blowable fuse.

A further object of the invention is to provide a programmable read-only memory having the highest possible bit density and read-out rate.

The invention is based on the recognition that loss of energy during blowing and hence the blowing current and the write time can be reduced by thermally insulating the fuse relative to its surroundings as well as possible.

For that purpose, according to the invention, a programmable semiconductor device is characterized in that the blowable fuse is present in a hollow space which is present in material which is provided over the supporting member or the semiconductor circuit element, while the blowable fuse extends over a part of its length separated from walls which surround the hollow space.

The advantage of such a device is that the blowable fuse now is substantially not in contact with the supporting member or a surrounding dielectric passivating layer so that the thermal conductivity to the surroundings is considerably reduced and thus the fuse will be blown more rapidly. In such a construction the write time is thus considerably shortened while in addition a lower blowing current will suffice.

Since the blowable fuse is generally over the greater part of its length free from the walls of the cavity and from the semiconductor circuit element and the supporting member drop formation of the material of the fuse can rapidly occur during the fusing, while in addition the molten material can rapidly move in the hollow space. The write time is even further reduced by this.

It is also prevented that particles released during blowing land elsewhere on the surface of the device and possibly cause short-circuit or other damages there.

A preferred embodiment of a programmable semiconductor device according to the invention is characterized in that the first line comprises a conductor which forms part of the wall of the hollow space opposite to the supporting member or the semiconductor circuit element and the other walls are formed at least partly by protective material, which protective material is provided over parts of the supporting member or the semiconductor circuit element present beside the conductor.

Such a construction presents advantages in the manufacture in that the protective layer can now be deposited with the said conductor as a mask.

Since in addition the semiconductor circuit element (for example a diode) can be provided below the blowable fuse, programmable read-only memories manufactured with such devices can have a high bit density.

For use in a programmable semiconductor memory, a programmable semiconductor device according to the invention is characterized in that the first line forms part of a first group of lines which forms a cross-bar system with a second group of lines which crosses the first group of lines, the first line being connected to a line of the second group at the area of a crossing of the cross-bar system by means of the blowable fuse and the semiconductor circuit element.

Another preferred embodiment of a programmable semiconductor device according to the invention is characterized in that the supporting member comprises a semiconductor body in which the semiconductor circuit element is realized.

The advantage of such a construction is that other circuits can also be realized in the semiconductor body, for example, decoders for selection purposes and output amplifiers. Moreover, the second group of lines in such a device may be constructed entirely or partly as zones buried in the semiconductor body. Such a buried zone is preferably contacted at regular distances with a strip of electrically conductive material present on the surface of the semicondcutor body. The advantage of this is that during programming several current paths to the same semiconductor circuit element are present which in addition have a lower resistance so that a lower voltage will suffice. At the same time, during reading the read time of the device will be shortened due to the presence of said low-ohmic parallel connections in the second group of lines.

The semiconductor circuit element which may be formed, for example, by a diode or a transistor in this construction preferably comprises a diode having a rectifying junction (Shottky junction) between a low-doped semiconductor zone above the buried zone and an electrode contacting the low-doped semiconductor zone. This gives, a memory manufactured by means of such a device has a high read-out rate.

A method of manufacturing a programmable semiconductor device according to the invention is characterized in that there is started with a supporting member having at a surface at least a first line and at least a semiconductor circuit element which has an electrode or is connected electrically conductively to a contact layer, in which the assembly is covered with a first auxiliary layer in which a first window which exposes at least a part of the electrode or the contact layer and a second window which exposes at least a part of the first line are provided, after which a blowable fuse which connects the first line to the semiconductor circuit element is provided on the first auxiliary layer and at least in the first and second windows, after which the assembly is covered with a second auxiliary layer and apertures are formed through the first and second auxiliary layers, after which a first layer of protective material is provided and patterned, in which protective material remains at least at the area of the blowable fuse and in the apertures, after which the two auxiliary layers are removed selectively using said pattern as a mask, in which the material of the first auxiliary layer can be etched selectively with respect to the material of the supporting member, the first line, the electrode or the contact layer and the blowable fuse, the protective material and, at least insofar as covered by the first auxiliary layer, the material of the semiconductor circuit element, and in which the material of the second auxiliary layer can be etched selectively with respect to the protective material and the material of the blowable fuse, by which treatment protective material remains both in the apertures and at the area of the blowable fuse at a distance from the fuse, after which at least the part of the surface which is not protected by the pattern from the first layer of protective material is provided with a second layer of protective material so that a hollow space remains in which the blowable fuse is present while walls of the hollow space comprise protective material of the first and second layers of protective material.

Preferably the same material is used for the two layers of protective material.

A method of manufacturing a programmable semiconductor device in accordance with the invention in which the wall opposite to the supporting member of the semiconductor circuit element comprises a conductor is characterized in that there is started with a supporting member having at a surface at least a semiconductor circuit element which comprises an electrode or is electrically conductively connected to a contact layer, in which the assembly is covered with a first auxiliary layer in which a window is provided which exposes at least a part of the electrode or the contact layer, after which a blowable fuse is provided on the first auxiliary layer and at least in the window in such manner that a first end of the blowable fuse is defined at the area of the window, after which the assembly is covered with a second auxiliary layer and apertures are formed through the first and second auxiliary layers, which apertures coincide at least partly with a second end of the blowable fuse, after which a pattern of conductors is provided at least at the area of the blowable fuse and in the apertures, after which the two auxiliary layers are removed selectively using said pattern as a mask, in which the material of the first auxiliary layer can be etched selectively with respect to the materials of the supporting member, the electrode or the contact layer, the blowable fuse and the pattern of conductors and, at least insofar as covered by the first auxiliary layer, the material of the semiconductor circuit element, and in which the material of the second auxiliary layer can be etched selectively with respect to the materials of the pattern of conductors and the blowable fuse by which treatment a conductor remains at the area of the blowable fuse and at a distance therefrom and supporting element of the conductor remain in the apertures after which at least the part of the surface which is not protected by the pattern of conductors is provided with a layer of protective material so that a hollow space is formed in which the blowable fuse is present which connects the semiconductor circuit element to the electric conductor, which conductor belongs to a line of the programmable semiconductor device and in which the walls of the hollow space are formed by the conductor and parts of the layer of protective material.

In such a method the same material is preferably used for the first and second auxiliary layers. This provides a simplified and hence cheaper method. A suitable material is, for example, aluminum.

The material of the conductor pattern is preferably provided by electrodeposition. As a matter of fact it has been found that pin holes in a deposited layer of aluminum may be present. Since during the electrodeposition the growth occurs only in one direction it can be prevented that said pin-holes are filled with the material of the conductor pattern and thus possible short-circuits occur.

BRIEF DESCRIPTION OF THE DRAWINGS

The invention will now be described in greater detail with reference to a few embodiments and the drawings, in which FIG. 8 shows schematically an electric equivalent circuit diagram of a part of a programmable semiconductor memory manufactured with programmable semiconductor devices shown in FIGS. 1, 2 and 3, while

Figure 1:
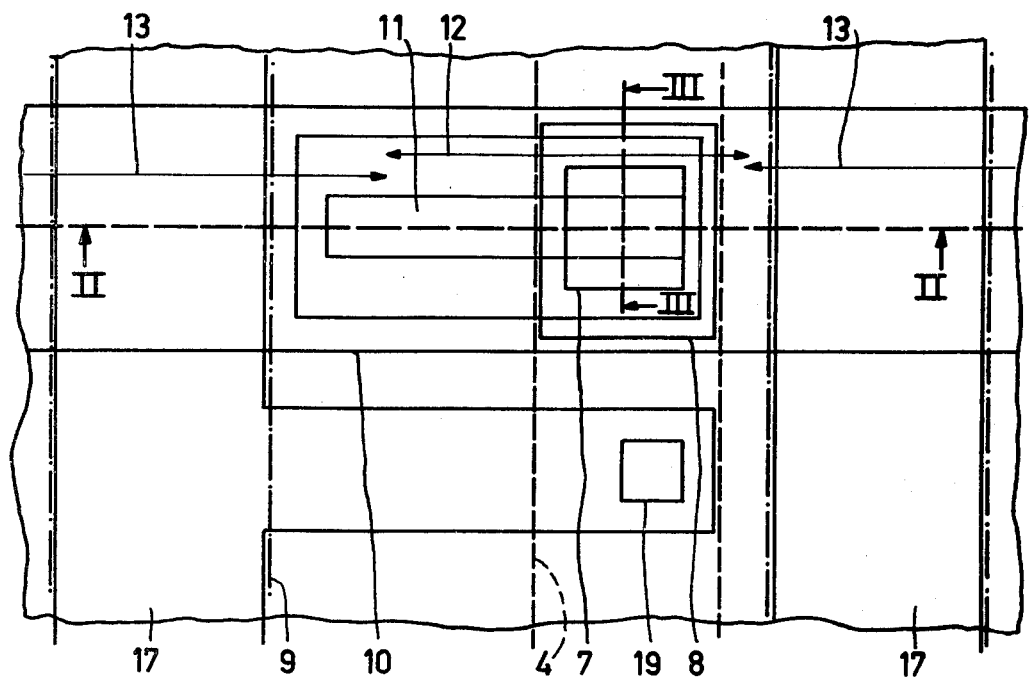
FIG. 1 is a diagrammatic plan view of a first embodiment of a programmable semiconductor device according to the invention.

The Figures are diagrammatic and not drawn to scale in which for clarity in the cross-sectional views in particular the dimensions in the direction of thickness are strongly exaggerated. Semiconductor zones of the same conductivity type are generally shaded in the same direction; corresponding parts in the various embodiments are generally referred to by the same reference numerals.

DESCRIPTION OF THE PREFERRED EMBODIMENT

Figure 2:
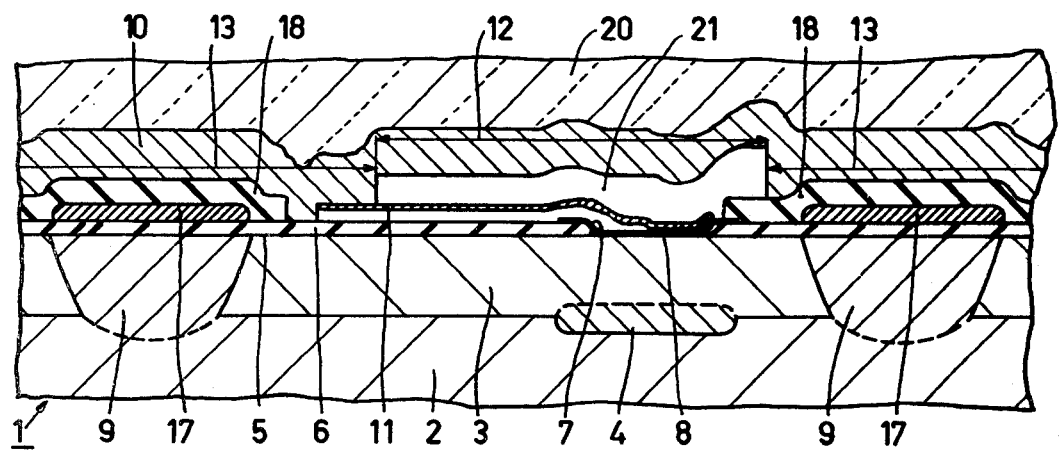
FIG. 2 is a diagrammatic cross-sectional view of the programmable semiconductor device taken on the line II—II of FIG. 1.
Figure 3:
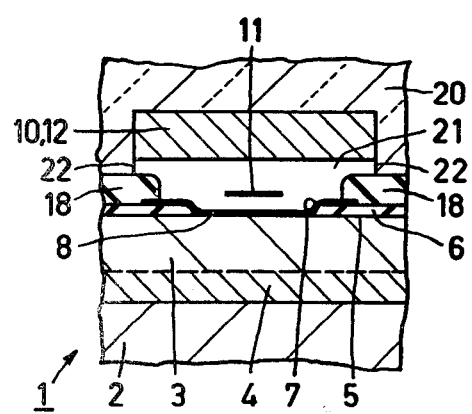
FIG. 3 is a diagrammatic cross-sectional view of the programmable semiconductor device taken on the line III—III in FIG. 1.

FIG. 1 is a diagrammatic plan view and FIGS. 2 and 3 are diagrammatic cross-sectional views taken on the lines II—II and III—III of FIG. 1 of a programmable semiconductor device according to the invention.

In this example a semiconductor body 1 forms a part of a supporting member. This semiconductor body 1 comprises a semiconductor substrate 2 of a first conductivity type, for example the p-type with a thickness of approximately 500 micrometers and a resistivity of approximately 1 ohmcentimeter (corresponding to an acceptor doping of approximately $3.10^{15}$ atoms/cm$^3$). An n-type epitaxial layer 3 is grown on said semiconductor substrate 2 in a thickness of approximately 5 micrometers and a resistivity of approximately 1 ohmcentimeter (corresponding to a doping of approximately $1.10^{15}$ atoms/cm$^3$).

In this example the programmable semiconductor device forms part of a programmable read-only memory having a cross-bar system of groups of lines crossing each other. A line of such a group is formed in this example by the low-ohmic buried zone 4 having a sheet resistance of approximately 20 ohm/square. In this example this line forms the bit line of a programmable read-only memory.

The semiconductor circuit elements which may be, for example, diodes or transistors, are formed in this example by rectifying junctions (Shottky diodes) provided above the buried zone 4. For this purpose an insulating layer 6 of, for example, silicon oxide having a thickness of approximately 0.5 micrometer provided on the surface 5 of the semiconductor body 1 comprises a window 7 in which an electrode 8 is provided of a material which forms a rectifying junction (Shottky junction) with the high ohmic n-type epitaxial silicon. In this example the electrode comprises a platinum-nickel alloy; other suitable materials are, for example, chromium, tantalum, palladium or aluminium.

In order to insulate the semiconductor circuit elements and the buried zone 4 electrically from other elements within the semiconductor body 1, for example, a similar zone extending parallel to the buried zone 4 with associated semiconductor circuit elements, the semiconductor body 1 comprises separation zones 9 of the p-type which are provided, for example, by means of a deep diffusion through the n-type epitaxial layer 3.

The semiconductor circuit element is present at the area of a crossing of the buried zone 4 belonging to a group of lines of the cross-bar system and a conductor 10. This conductor 10 belongs to another group of lines of the cross-bar system and in this example forms part of a word line. A blowable fuse 11 at its one end is connected electrically conductively to the electric conductor 10. The other end is electrically conductively connected to the semiconductor circuit element, namely to the electrode 8. The blowable fuse is situated at a distance from the supporting member (the semiconductor body 1, including passivating layer 6 and a nitride layer 8 provided thereon) and according to the invention is present in a hollow space 21 the wall of which opposite to the circuit element comprises a bridging part 12 of the crossing conductor 10 between two supporting parts 13 forming part of the conductor 10.

Parts 22 of the other walls are formed by a layer 20 of a protective material, for example glass or silicon oxide, which in this example is provided over the conductor 10 and juxtaposed parts of the supporting member. The fuse 11 in this example comprises a conductive strip of nickelchromium in a thickness of approximately 0.08 micrometer. In this example, strips 17 of conductive material, for example, aluminium, are provided on the insulating layer 6 and are electrically insulated relative to the electric conductors 10 by means of the layer 18 of silicon nitride. In the case of a programmable read-only memory such a strip is contacted at regular distances contact holes 19 with the buried zone 4 and in this example reduces the series resistance in the bit line.

When, for example, in a programmable read-only memory, a positive electric voltage is applied between the conductor 10 and the buried zone 4 by means of addressing circuits and, if necessary, amplifier circuits, a current starts flowing through the conductor 10, the blowable fuse 11 the electrode 8 and the epitaxial layer 3 to the buried layer 4. When this current has a sufficiently high value the fuse 11 will melt as a result of heat generation and the connection between the conductor 10 of the cross-bar system and the electrode 8 will be permanently interrupted. In this manner such a read-only memory can be written (programmed).

Since the fuse is present within the hollow space 21, the heat dissipation of the fuse 11 is very small, which leads to a very short writing time. Moreover, the molten material of the strip 11 cannot land on other parts of the device outside the cavity 21 and cause short-circuit or damage there.

The circuit element, in this example a Schottky diode, is present entirely below the conductor 10; as a result of this a high bit density can be reached. The use of Schottky diodes in the device shown also increases notably the read-out rate of a programmable semiconductor memory in which such a device is used.

In this example the buried zone 4 forms part of a bit line of a programmable read-only memory. In general this zone will be highly doped but still have some resistance. In order to reduce the response time of said line it is contacted at regular distances with a strip 17 of conductive material which is provided on the surface 5 of the semiconductor body 1 and in this example extends parallel to said zone 4. As a result of this a parallel current path is introduced with reduces the response time. The strip 17 also has advantages in programming.

Figure 8:
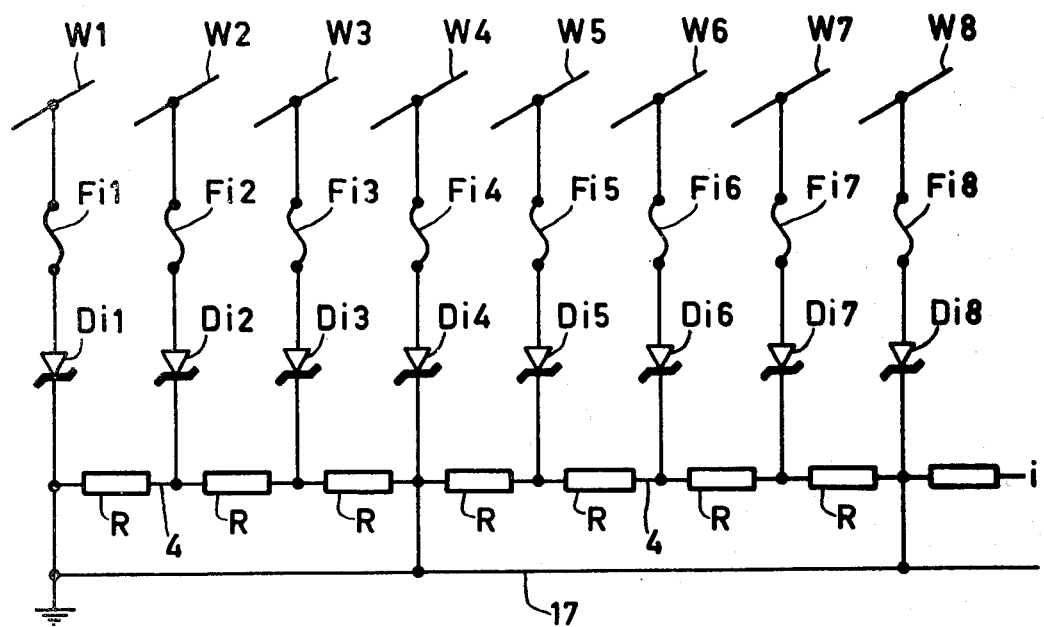

FIG. 8 shows schematically a part of a bit line i with associated semiconductor circuit elements, in this example Schottky diodes Di1 . . . Di8. These diodes are connected to word lines W1 . . . W8 by means of blowable fuses Fi1 . . . F8. The bit line i in the present example is formed by a buried zone 4. However, this has a certain divided series resistance, in FIG. 8 shown schematically by the resistors R. For blowing, for example, the fuse Fi6, The current through said fuse and the diodes Di6 will have to be sufficiently high to produce this blowing. When the parallel conductor 17 is absent it holds for this current with an applied voltage V that $$i = (V - V_D)/5\, R = 1/5(V - V_D)/R = i_0$$

wherein
V: applied voltage
$V_D$: forward voltage of the diode
R: average series resistance in the zone 4 between two successive crossings.

When the parallel conductor 17 the resistance of which can be substantially neglected is connected, for example, at the area of Di4 and Di8, however, it holds that:

$$i = V - V_D/2\, R + V - V_D/2\, R = V - V_D/R = 5\, i_0$$

This shows that the provision of such a parallel conductor gives rise to higher currents at the same applied voltage so that the fuse will blow more rapidly and hence the write time will be shortened.

Figure 4:
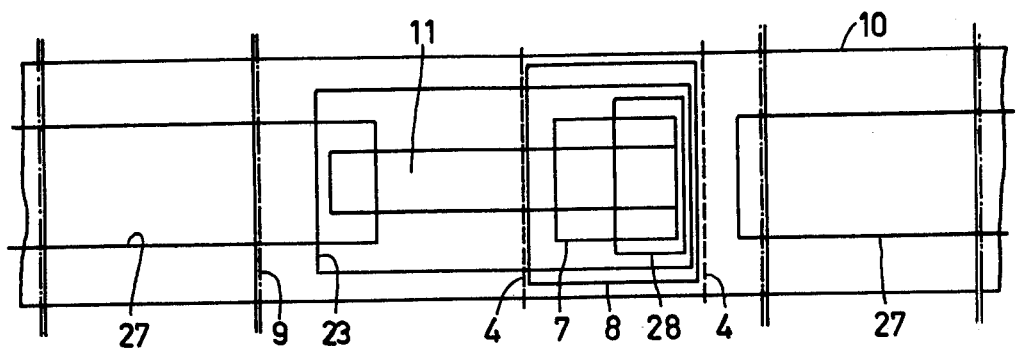
FIG. 4 shows diagrammatically a few mask apertures used in a number of manufacturing steps of the programmable semiconductor device shown in FIGS. 1 to 3, FIGS. 5 to 7 show the programmable semiconductor device of FIG. 2 during various stages of its manufacture.
Figure 5:
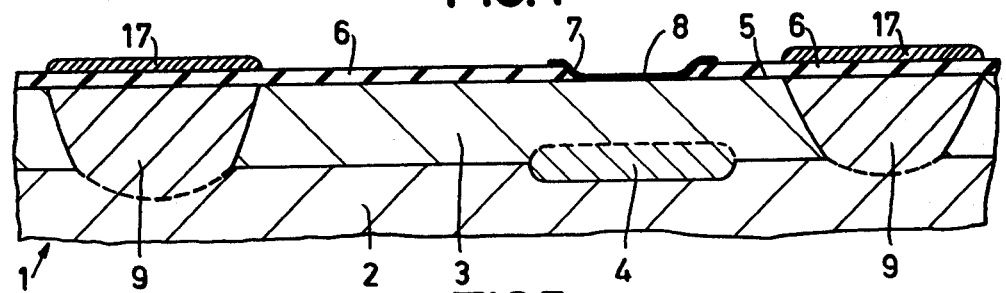
Figure 6:
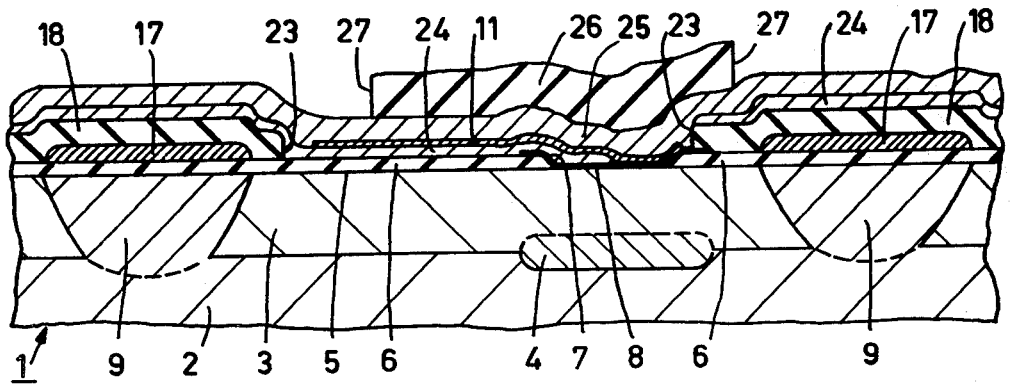
Figure 7:
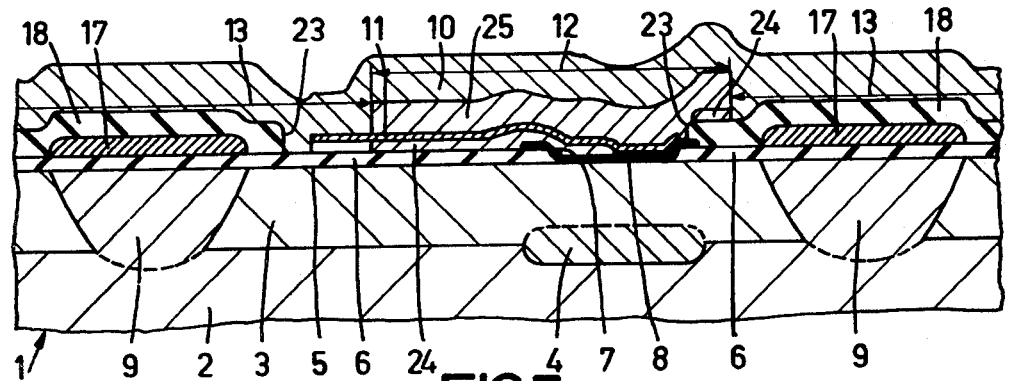

The manufacture of a programmable semiconductor device shown in FIGS. 1 to 3 will now be explained with reference to FIGS. 4 to 7, in which FIG. 4 shows diagrammatically the mask apertures used in a number of manufacturing steps, while FIGS. 5 to 7 show the device of FIG. 2 in various stages of its manufacture.

Starting material is a p-type substrate 2 having a resistivity of 1 ohm.cm and a thickness of approximately 500 micrometers. In this substrate buried zones 4 of the n-type are provided in the usual manner (having a sheet resistance of approximately 20 ohm per square). An epitaxial layer 3 is then grown in a thickness of approximately 5 micrometers and a resistivity of approximately 1 ohm.cm. Separation zones 9 are then provided, also in generally known manner, by means of diffusion. After having cleaned, if desired, the surface 5 of the device thus obtained removing oxide layers grown in previous steps), a layer 6 of insulating material, for example silicon oxide, is provided over the whole surface 5 in which layer 6 contact windows 7 are then etched. A thin layer 8 (approximately 0.1 micrometer) of platinum-nickel is provided in said windows and forms a Schottky junction with the underlying high-ohmic silicon. Other suitable material are, for example, palladium, chromium or tantalum. This layer 8 may project slightly over the edge of the window 7, so the provision of the layer 8 is not critical. If desired, a thin titanium-tungsten layer may be provided over the layer 8 so as to obtain a good contacting with the fuse. Conductive tracks 17 of, for example, aluminum are also provided in a generally known manner on the insulating layer 6. In order to be able to contact these tracks in a larger configuration of several elements at regular distances with the semiconductor circuit elements, contact windows 19 (see FIG. 1) which during the manufacture of the electrodes 8 are covered, if desired, are provided in the layer 6 simultaneously with the provision of windows 7. Herewith the configuration shown in FIG. 5 is obtained.

The device thus obtained is then covered with a layer 18 of silicon nitride in a thickness of approximately 0.7 micrometer, for example, by means of plasma deposition. This layer 18 is provided photolithographically with a window 23 so that parts of the electrode 8 and the insulating layer 6 become exposed. The whole device is then covered with an approximately 0.3 micrometer thick layer 24 of aluminum in which a window 28 (see FIG. 4) is provided photolithographically. In a subsequent step a blowable fuse 11 is formed by depositing an approximately 0.08 micrometer thick layer of nickel-chromium which is then patterned photolithographically by means of a dilute hydrochloric acid solution. In this example the remaining nickel-chromium is a strip-shaped rectangle 11 which is situated within the window 23 (see FIG. 4) and contacts the electrode 8 through a part of the window 28. Of course, variations are possible in the shape of the fuse 11. A layer 25 of aluminium in a thickness of approximately 0/7 micrometer is then provided. The assembly is provided with the photoresist layer 26 in which windows 27 are defined photolithographically at the area of supporting parts to be provided. Herewith the configuration shown in FIG. 6 is obtained.

Using the photoresist layer 26 as a mask, the aluminum of the layers 24, 25 is etched away at the area of the windows 27 in a 1% solution of sodium hydroxide at a temperature of approximately 40° C. after which the whole device is provided with a layer of nickel in a thickness of approximately 1 micrometer. This is preferably done by electrodeposition so as to prevent short circuits. As a matter of fact it has been found that the aluminum of the intermediate layers 24, 25 can usually still comprise apertures, so-called pin holes, which can be filled with nickel during the deposition of nickel by means of sputtering, which nickel is not attacked in a subsequent etching step and thus can cause short circuits. By using electrodeposition the growth occurs only in one direction so that short circuits are prevented, as described in Applicant's copending U.S. patent application Ser. No. 500,791, filed June 7, 1983, which is a continuation of U.S. Ser. No. 84,038, filed Oct. 12, 1979, the contents of which are deemed to be incorporated in this application by reference. A very thin layer of nickel, in the order of nanometers, is previously vapor-deposited indeed so as to ensure a good electrodeposition notably on the silicon oxide 6 and silicon nitride 18. However, this layer is too thin to cause said short circuit.

The electric conductors 10 are then etched from the layer of nickel thus provided by means of photolithographic etching methods by means of a solution of 10% nitric acid in water at approximately 40° C. Herewith the configuration shown in FIG. 7 is obtained in which aluminum 24, 25 is still present on the layer 18 of silicon nitride not only below the part 12 of the conductor 10 but also beyond the plane of the drawing. This aluminum is then removed in an etching bath of 1% sodium hydroxide in water at approximately 40° C. After the aluminum has been removed entirely from the supporting member, a passivating layer 20 of glass or silicon oxide is provided over the assembly by means of vapor deposition or other suitable deposition methods. The conductor 10 serves as a mask so that in the ultimate device the blowable fuse 11 is encapsulated within a space 21 a part 22 of the walls of which is formed by the passivating layer 20. Herewith the device shown in FIGS. 1 to 3 is obtained.

In the above-described preferred embodiment the (conductive) line 10 forms part of the wall of the hollow space. However, this is not necessary. For example, the line 10 may be provided on the surface of the supporting member or the semiconductor circuit element. In that case, after providing the first selectively etchable auxiliary layer 24, a first window is provided in said layer at the area of the electrode 8 of the semiconductor circuit element and a second window which exposes a part of the line 10. By means of photolithographic etching methods, the blowable fuse is defined from material provided on the first auxiliary layer in such manner that its two ends contact the electrode 8 and the line 10, respectively, the windows. A second selectively etchable auxiliary layer 25 is then provided over the assembly. Apertures are then provided through the two auxiliary layers, after which the assembly is covered with a first layer of protecting material, for example, silicon oxide. This layer, for example, has such a thickness that the apertures in the two auxiliary layers are filled. This layer is then patterned by etching in such manner that silicon oxide remains at the area of said apertures and above the blowable fuses, while elsewhere the second auxiliary layer becomes exposed. The two auxiliary layers 24, 25, are then removed in an analogous manner as described above by means of selective etching. After said removal step the blowable fuse 11 is present at a distance from the supporting member or the semiconductor circuit element and also at a distance from bridging silicon oxide, comparable to the bridging part 12 in FIGS. 1 to 3. The bridging silicon oxide is present between two supporting elements (analogous to the supporting elements 13 in FIGS. 1 to 3) also of silicon oxide. In places not protected by the oxide pattern the auxiliary layers 24, 25 are removed so that parts of the surface of the supporting member or the semiconductor circuit element are exposed. These parts of the surface present between the oxide pattern serving as a mask are then covered with a second layer of protective material. When said second layer is provided over a sufficient thickness, the blowable fuse is encapsulated in a hollow space.

Of course the invention is not restricted to the above examples but many variations are possible to those skilled in the art without departing from the scope of this invention. For example, the insulation between the buried zones 4 may take place by means of local oxidation methods, for example, instead of by the deep p-type zones 9, while pn-diodes or transistors (bipolar transistors as well as field effect transistors) may also be chosen for the circuit elements instead of Schottky diodes.

In the examples shown the parallel conductors 17 may be omitted, if desired. In that case the insulating layer 18 is not necessary either and the supporting parts 13 are provided directly on the insulating layer 6.

In the examples shown the supporting member is formed by the semiconductor body in which the semiconductor circuit elements are realized. In another embodiment it is possible to provide the semiconductor circuit elements on an insulating supporting member by means of the silicon on saffire method.

Figure 9:
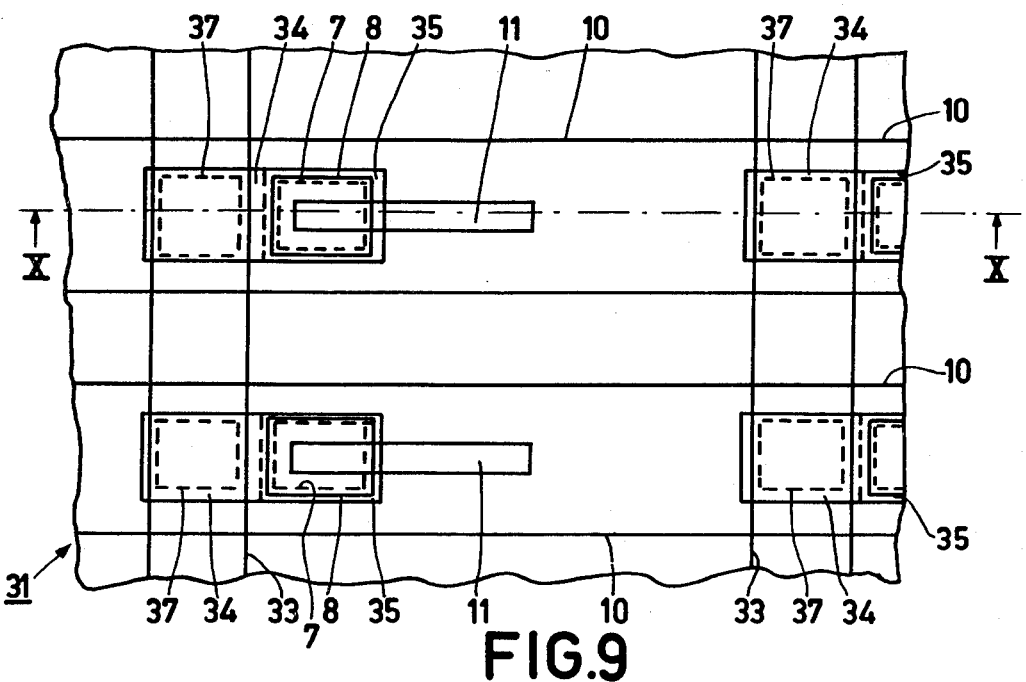
FIG. 9 is a diagrammatic plan view and FIG. 10 is a cross-sectional view taken on the line X—X in FIG. 9, of still another embodiment of a programmable semiconductor device in accordance with the invention.
Figure 10:
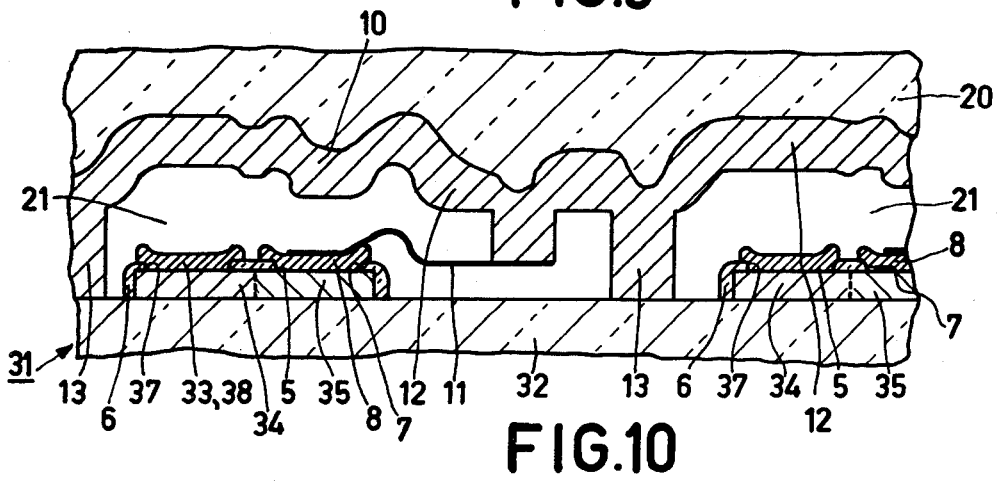

FIG. 9, for example, is a plan view and FIG. 10 is a cross-sectional view taken on the line X—X in FIG. 9 of such a programmable semiconductor device according to the invention.

The device 31 in this example comprises a supporting member 32 of insulating material, for example sapphire, on which a cross-bar system is provided of conductor tracks 33 provided on the supporting member 32 and conductors 10 crossing said conductor tracks 33. At the area of the crossings of the cross-bar system semiconductor circuit elements, in this example diodes with p-type zones 34 and n-types zones 35, are provided on the insulating supporting member 32. The conductors 10 bridge the diodes and are supported at the area of supporting parts 13.

Figure 11:
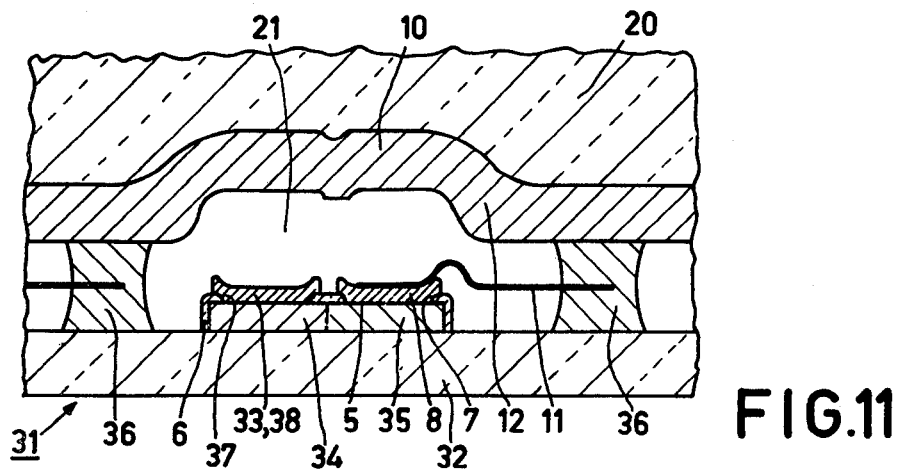
FIG. 11 is a diagrammatic cross-sectional view of a modified embodiment of the device shown in FIG. 10.

The conductor tracks 33 which, for example, again form bit lines of a programmable read-only memory, are contacted with the p-type zones 34 at the surface 5 of the diodes contacts 38 and windows 37 provided in an insulating layer 6 protecting the diodes. Electrodes 8 contact the n-type zones 35 contact windows 7. Below the conductors 10 a blowable fuse 11 is again present which in this example connects the conductor 10 to the electrode 8 and extends over a part of its length separately from the supporting member 32 and the semiconductor circuit element and also separately from the conductor 10. The semiconductor circuit element (diode) is present below a bridging part 12 between two supporting parts 13 of the conductor 10. Of course, several diodes may be present below one bridging part 12. The assembly is again covered with a passivating layer 20, so that the blowable fuse 11 is present in a hollow space 21. In the manufacture of the cross-bar system according to the method described in U.S. patent application Ser. No. 500,791 the conductors 10 are supported by supporting parts 36 of aluminium which is conductively connected to the conductors 10. In such a device it is also possible to connect the blowable fuse 11 to the conductor 10 the supporting part 36 in an electrically conductive manner. FIG. 11 is a cross-sectional view of such a device. Reference numerals in this Figure again have the same meaning as those of FIG. 10.

What is claimed is:

1. A programmable semiconductor device comprising a supporting member having at least a first line and at least a semiconductor circuit element connected to said first line by means of blowable fuse, in which the blowable fuse is situated at least over a part of its length at a distance from the supporting member or the semiconductor circuit element, characterized in that:

the blowable fuse is present in a hollow space which is present in material which is provided over the supporting member or the semiconductor circuit element;

the blowable fuse extends over a part of its length separated from walls which surround the hollow space;

said first line comprises a conductor which forms part of the wall of the hollow space opposite to the supporting member of the semiconductor circuit element;

the other walls are formed at least partly by protective material, which protective material is provided over parts of the supporting member or the semiconductor circuit element situated beside the conductor;

said first line forms part of a first group of lines which forms a cross-bar system with a second group of lines which crosses the first group of lines, said first line being connected to a line of the second group at the area of a crossing of the cross-bar system by means of the blowable fuse and the semiconductor circuit element;

said supporting member comprises a semiconductor body in which the semiconductor circuit element is realized;

said second group of lines comprises at least a zone buried in said semiconductor body;

said buried zone is contacted at regular distances to a strip of electrically conductive material present on the surface of the semiconductor body;

said strip of electrically conductive material extends substantially parallel to the buried zone; and
said semiconductor element comprises diodes having a rectifying junction between a low-doped semiconductor zone above the buried zone and an electrode contacting the low-doped semiconductor zone.

* * * * *